(12) United States Patent
Ganguli et al.

(10) Patent No.: US 10,199,230 B2
(45) Date of Patent: Feb. 5, 2019

(54) METHODS FOR SELECTIVE DEPOSITION OF METAL SILICIDES VIA ATOMIC LAYER DEPOSITION CYCLES

(71) Applicant: APPLIED MATERIALS, INC., Santa Clara, CA (US)

(72) Inventors: Seshadri Ganguli, Sunnyvale, CA (US); Yixiong Yang, Santa Clara, CA (US); Bhushan N. Zope, Santa Clara, CA (US); Xinyu Fu, Pleasanton, CA (US); Avgerinos V. Gelatos, Redwood City, CA (US); Guoqiang Jian, San Jose, CA (US); Bo Zheng, Saratoga, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 14/790,862

(22) Filed: Jul. 2, 2015

(65) Prior Publication Data

US 2016/0322229 A1 Nov. 3, 2016

Related U.S. Application Data

(60) Provisional application No. 62/155,963, filed on May 1, 2015.

(51) Int. Cl.
*H01L 21/285* (2006.01)
*H01L 21/768* (2006.01)
*H01L 23/532* (2006.01)

(52) U.S. Cl.
CPC .. *H01L 21/28518* (2013.01); *H01L 21/28562* (2013.01); *H01L 21/76843* (2013.01);
(Continued)

(58) Field of Classification Search
CPC ......... H01L 21/28518; H01L 21/76843; H01L 21/76846
See application file for complete search history.

(56) References Cited

U.S. PATENT DOCUMENTS

| | | | |
|---|---|---|---|
| 5,084,417 A | 1/1992 | Joshi et al. | |
| 6,174,809 B1 * | 1/2001 | Kang | C23C 16/45561 257/E21.165 |

(Continued)

OTHER PUBLICATIONS

International Search Report and Written Opinion dated Jul. 29, 2016 for PCT Application No. PCT/US2016/029172.

*Primary Examiner* — Bryan Junge
(74) *Attorney, Agent, or Firm* — Moser Taboada; Alan Taboada

(57) ABSTRACT

Methods for selectively depositing a metal silicide layer are provided herein. In some embodiments, a method of selectively depositing a metal silicide layer includes: (a) providing a substrate having a first layer to a process chamber, wherein the first layer comprises a first surface and a feature formed in the first surface comprising an opening defined by one or more sidewalls and a bottom surface wherein the sidewalls comprise one of silicon oxide or silicon nitride and wherein the bottom surface comprises at least one of silicon or germanium; (b) exposing the substrate to a precursor gas comprising a metal halide; (c) purging the precursor gas from the process chamber using an inert gas; (d) exposing the substrate to a silicon containing gas; (e) purging the silicon containing gas from the process chamber using an inert gas; (f) repeating (b)-(e) to selectively deposit a metal silicide along the bottom surface to a predetermined thickness; and (g) annealing the substrate after depositing the metal silicide layer.

19 Claims, 3 Drawing Sheets

(52) U.S. Cl.
CPC .. *H01L 21/76855* (2013.01); *H01L 23/53238* (2013.01); *H01L 23/53266* (2013.01)

(56) References Cited

U.S. PATENT DOCUMENTS

| | | | |
|---|---|---|---|
| 6,524,952 B1* | 2/2003 | Srinivas | H01L 21/28518 257/E21.165 |
| 7,638,437 B2* | 12/2009 | Seo | C23C 16/06 257/E21.171 |
| 7,858,518 B2 | 12/2010 | Hill et al. | |
| 2002/0000653 A1* | 1/2002 | Lin | C23C 16/0281 257/734 |
| 2003/0027401 A1 | 2/2003 | Iyer et al. | |
| 2004/0127027 A1* | 7/2004 | Lee | H01L 21/28518 438/683 |
| 2005/0042865 A1* | 2/2005 | Cabral, Jr. | H01L 21/28088 438/680 |
| 2005/0205110 A1* | 9/2005 | Kao | H01J 37/32082 134/1.1 |
| 2007/0148350 A1* | 6/2007 | Rahtu | C23C 16/32 427/249.17 |
| 2008/0242097 A1 | 10/2008 | Boescke et al. | |
| 2011/0263115 A1* | 10/2011 | Ganguli | C23C 16/06 438/595 |
| 2012/0012926 A1 | 1/2012 | Ha et al. | |
| 2013/0196505 A1* | 8/2013 | Hasegawa | H01L 21/76898 438/664 |
| 2013/0252417 A1* | 9/2013 | Ishizaka | C23C 14/025 438/643 |
| 2014/0120712 A1 | 5/2014 | Ganguli et al. | |

* cited by examiner

METHODS FOR SELECTIVE DEPOSITION OF METAL SILICIDES VIA ATOMIC LAYER DEPOSITION CYCLES

CROSS-REFERENCE TO RELATED APPLICATIONS

This application claims benefit of U.S. provisional patent application Ser. No. 62/155,963, filed May 1, 2015, which is herein incorporated by reference in its entirety.

FIELD

Embodiments of the present disclosure generally relate to methods of selectively depositing a metal silicide layer via atomic layer deposition cycles.

BACKGROUND

The formation of a logic-contact structure typically involves formation of a metal silicide at the bottom of a feature. The inventors have observed that when forming a contact within a narrow feature (e.g., 10 nm or less), metal may deposit along the sidewalls of the feature as well as at the bottom of the feature. The metal formation along the sidewalls reduces the amount of conductive fill material that can be deposited within the feature, resulting in an undesirable increase in the contact resistance.

Accordingly, the inventors have developed improved techniques to selectively deposit a metal silicide layer via atomic layer deposition cycles.

SUMMARY

Methods for selectively depositing a metal silicide layer are provided herein. In some embodiments, a method of selectively depositing a metal silicide layer includes: (a) providing a substrate having a first layer to a process chamber, wherein the first layer comprises a first surface and a feature formed in the first surface comprising an opening defined by one or more sidewalls and a bottom surface, wherein the sidewalls comprise one of silicon oxide or silicon nitride and wherein the bottom surface comprises at least one of silicon or germanium; (b) exposing the substrate to a precursor gas comprising a metal halide; (c) purging the precursor gas from the process chamber using an inert gas; (d) exposing the substrate to a silicon containing gas; (e) purging the silicon containing gas from the process chamber using an inert gas; (f) repeating (b)-(e) to selectively deposit a metal silicide along the bottom surface to a predetermined thickness; and (g) annealing the substrate after depositing the metal silicide layer.

In some embodiments, a method of selectively depositing a metal silicide layer, includes: (a) providing a substrate having a first layer to a process chamber, wherein the first layer comprises a first surface and a feature formed in the first surface comprising an opening having a width of less than about 10 nm and defined by one or more sidewalls and a bottom surface, wherein the sidewalls comprise one of silicon oxide or silicon nitride and wherein the bottom surface comprises at least one of silicon or germanium; (b) exposing the substrate to a precursor gas comprising a metal halide; (c) purging the precursor gas from the process chamber using an inert gas; (d) exposing the substrate to a silicon containing gas; (e) purging the silicon containing gas from the process chamber using an inert gas; f) repeating (b)-(e) to selectively deposit a metal silicide along the bottom surface to a predetermined thickness; (g) annealing the substrate for about 1 millisecond to about 1 minute after depositing the metal silicide layer; (h) depositing a capping layer within the feature after depositing and annealing the metal silicide layer; (i) depositing a liner layer atop the capping layer; and (j) depositing a conductive fill material atop the liner layer to substantially fill the feature.

In some embodiments, a computer readable medium, having instructions stored thereon which, when executed, cause a process chamber to perform a method for selectively depositing a metal silicide layer are provided herein. The method may include any of the embodiments disclosed herein.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

Figure 1:
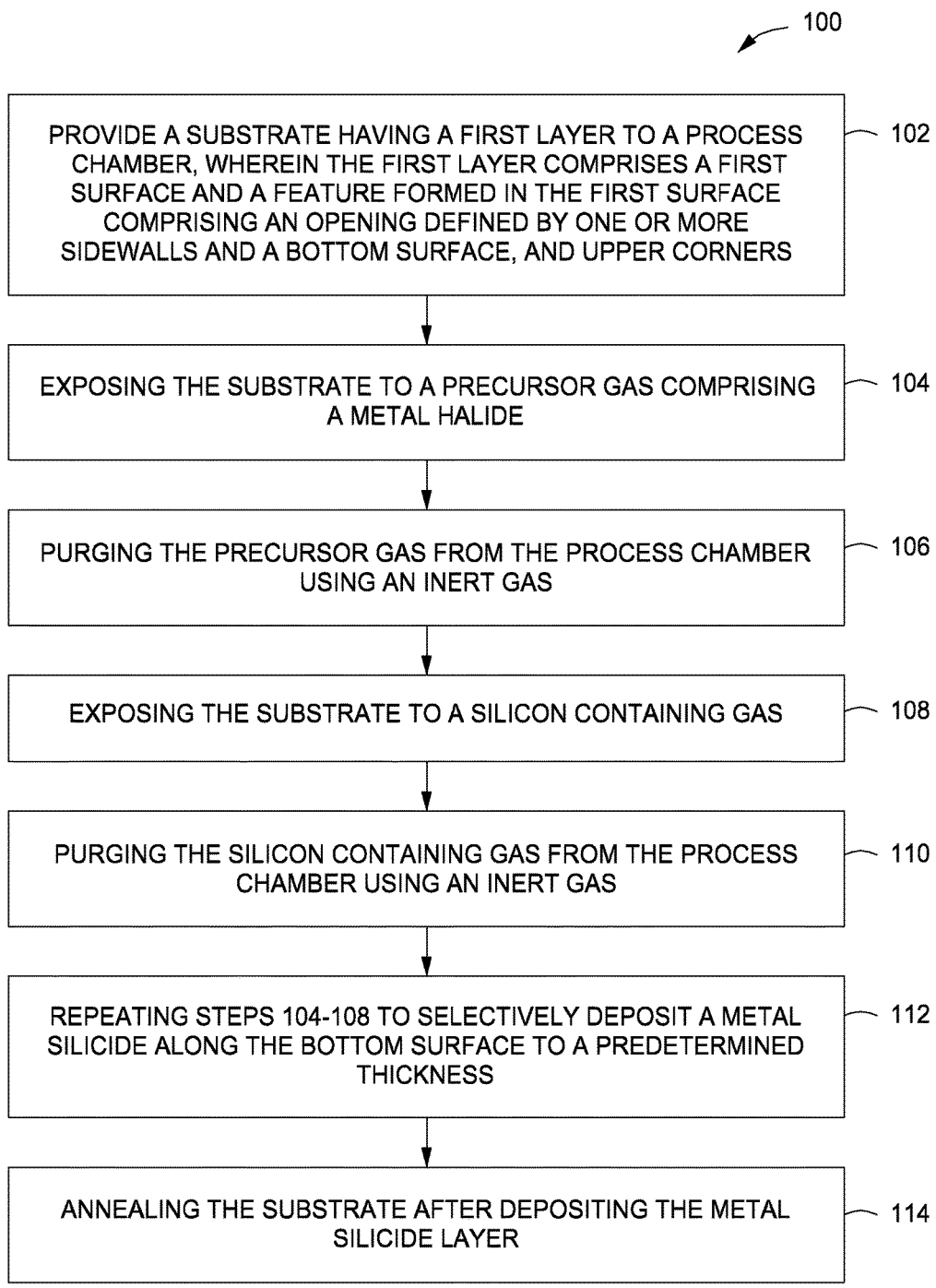
FIG. 1 depicts a flow chart of a method for selectively depositing a metal silicide layer in accordance with some embodiments of the present disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Methods for selectively depositing a metal silicide layer are provided herein. The inventive methods advantageously facilitate selectively depositing a metal silicide layer at the bottom of a feature (for example, a contact) and not along the sidewalls (or to a much lesser degree). By selectively depositing a metal silicide layer along the bottom of the feature, the metal silicide layer takes up less space in the feature. The smaller amount of metal silicide in the feature advantageously results in improved resistance because there is a greater amount of conductive fill material in the feature. The inventive methods may be utilized in the formation of metal interconnects in an integrated circuit, or in the formation of a metal gate or a metal-contact gap fill process, as well as other suitable applications utilizing filling a feature with a conductive material.

Figure 2A:
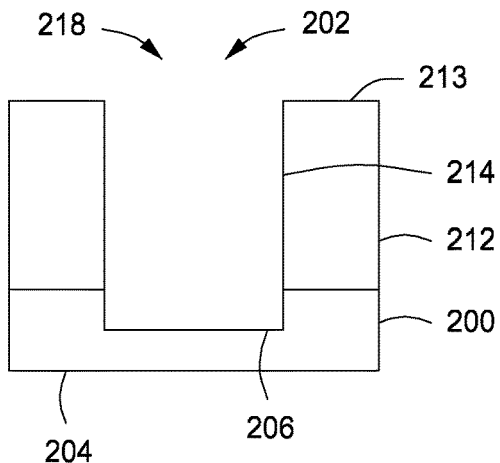
FIGS. 2A-2C depict the stages of selectively depositing a metal silicide layer in accordance with some embodiments of the present disclosure.

FIG. 1 depicts a flow chart of a method 100 for selectively depositing a metal silicide layer in accordance with some embodiments of the present disclosure. The method 100 is described below with respect to the stages of selectively depositing a metal silicide layer as depicted in FIGS. 2A-2C and may be performed, for example, in a suitable reactor, such as is described below with respect to FIG. 3.

The method 100 starts at 102 by providing a substrate, such as the substrate 200, to a processing volume of a substrate processing chamber, for example process chamber 302 described below with respect to FIG. 3. In some embodiments, as shown in FIG. 2A, the substrate 200 includes a first layer 212 having a first surface 213 with one or more features 202, formed in the first surface 213 of the substrate 200, and extending towards a base 204 of the substrate 200. In some embodiments, the feature 202 may be etched partially into the base 204 of the substrate 200. The substrate 200 may be any suitable substrate having the one or more features 202 formed in the substrate 200. For example, the substrate 200 may comprise one or more of silicon (Si), germanium, silicon germanium, doped or undoped polysilicon, doped or undoped silicon wafers and patterned or non-patterned wafers silicon on insulator (SOI), doped silicon, or the like. The substrate 200 may have various dimensions, such as 200 mm, 300 mm or 450 mm diameter wafers or other dimensions. In some embodiments, the substrate 200 comprises at least one of silicon or germanium. In some embodiments, the first layer 212 comprises silicon oxide (SiOx) or silicon nitride (SiN). In addition, the substrate 200 may include additional layers of materials or may have one or more completed or partially completed structures or devices formed in or on the substrate 200.

The feature 202 may be formed by etching the substrate 200 using any suitable etch process. In some embodiments, the feature 202 comprises an opening 218 defined by one or more sidewalls 214 and a bottom surface 206. In some embodiments, the feature 202 may be a via, contact, trench, dual damascene, or the like. In some embodiments, the opening 218 may have a width of less than about 10 nm. The feature 202 is formed in the substrate 200 or in layers disposed atop the substrate such that the bottom surface 206 is a different material than the predominant surfaces of the one or more sidewalls 214. For example, the feature 202 may be an opening 218 formed in the first layer 212 and extending deep enough such that the bottom surface 206 is formed by the substrate 200. In some embodiments, the substrate 200 (and as such the bottom surface 206) comprises silicon, germanium, or silicon germanium, and the first layer 212 (and as such the one or more sidewalls 214) comprises silicon oxide or silicon nitride.

Figure 2B:
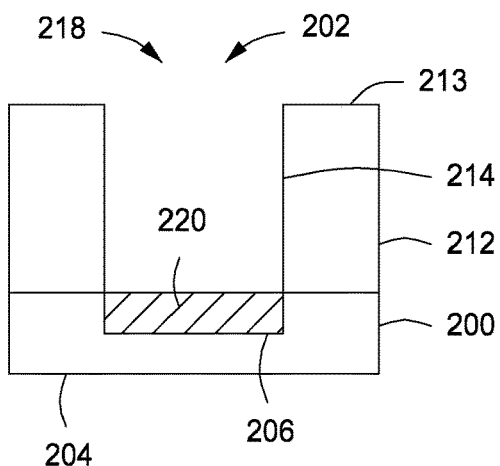
Figure 2C:
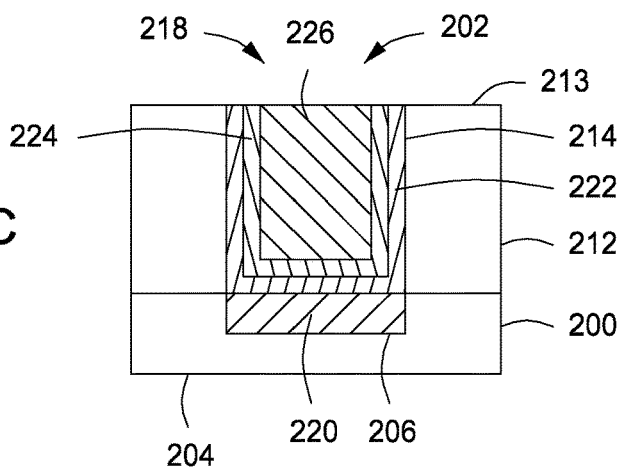

Next at 104, as depicted in FIG. 2B, the substrate 200 is exposed to a precursor gas comprising a metal halide, such as a metal chloride, as part of the process to selectively deposit the metal silicide layer 220 at the bottom surface 206 of the feature 202 but not on the sidewalls 214 of the feature 202, or with very little deposition on the sidewalls 214. Selective deposition on the bottom surface 206 means that material is deposited on the bottom surface 206 at a greater rate than on the one or more sidewalls 214, or in some embodiments, at a much greater rate (e.g., at least one order of magnitude greater) than on the one or more sidewalls 214. In some embodiments, no material is deposited on the sidewalls 214. However, while a predominant amount of material is deposited on the bottom surface 206, some deposition may occur on the one or more sidewalls 214. By selectively depositing the metal silicide layer predominantly or solely along the bottom of the feature, the metal silicide layer takes up less space in the feature than if there were a similar amount of metal silicide deposited along the one or more sidewalls. The smaller amount of metal silicide in the feature facilitates depositing a greater amount of conductive fill material in the feature, advantageously providing improved resistance.

The metal silicide layer comprises tantalum, hafnium, zirconium, or tungsten. In some embodiments, the metal halide is any suitable metal halide to deposit a metal silicide layer comprising one of tantalum, hafnium, zirconium, or tungsten. In some embodiments, the metal halide is a metal chloride, such as tantalum pentachloride ($TaCl_5$), hafnium tetrachloride ($HfCl_4$), zirconium tetrachloride ($ZrCl_4$), tungsten hexachloride ($WCl_6$), or tungsten pentachloride ($WCl_5$). In some embodiments, the precursor gas further comprises an inert gas, such as argon, helium, or the like. In some embodiments, the precursor gas may be provided at a flow rate of up to about 500 sccm. In some embodiments, a temperature of the process chamber of about 350 degrees Celsius to about 550 degrees Celsius. In some embodiments, a pressure of the process chamber during exposure to the precursor gas may be maintained at about 2 Torr to about 15 Torr. In some embodiments, the substrate may be exposed to the precursor gas for about 1 to about 10 seconds.

In some embodiments, prior to exposing the substrate 200 to the precursor gas, the substrate is exposed to a cleaning process to remove, for example, a native oxide layer on the bottom surface 206 of the feature 202. In some embodiments, the substrate is exposed to a remote $NH_3/NF_3$ plasma to provide highly selective $SiO_2$/Si removal by forming $NH_4F$ which is easy to react with Si—O or Si—N bonds at room temperature, but not with Si—Si bonds. The polymer $NH_4F$—$SiO_2$ can be sublimated and etched away when sufficiently heated.

Next, at 106, the processing volume of the process chamber is purged of the precursor gas. In some embodiments, the precursor gas is purged using any suitable inert gas, for example argon, xenon, helium, or the like.

Next, at 108, the substrate 200 is exposed to a silicon containing gas comprising silane ($SiH_4$) or derivatives thereof (e.g., disilane, trisilane, tetrasilane, chlorosilane, dichlorosilane, tetrachlorosilane, hexachlorodisilane, methylsilane, or the like). In some embodiments, the silicon containing gas may be provided at a flow rate of up to about 500 sccm. In some embodiments, the temperature of the process chamber may be maintained at about 350 degrees Celsius to about 550 degrees Celsius. In some embodiments, a pressure of the process chamber during exposure to the silicon containing gas may be about 2 Torr to about 15 Torr. In some embodiments, the substrate may be exposed to the silicon containing gas for about 0.5 to about 5 seconds. The inventors have observed that the silane or derivatives thereof described above react with chlorine where the precursor gas is a metal chloride.

Next, at 110, the processing volume of the process chamber is purged of the silicon containing gas. In some embodiments, the silicon containing gas is purged using any suitable inert gas, for example argon, xenon, helium, or the like. Alternately exposing the substrate to the metal halide and the silicon containing gas selectively deposits a thin layer of metal silicide along the bottom surface of the substrate. The inventors have observed that the metal halide precursor and the silane react with the termination of the chemical bonds, for example the silicon bonds, at the bottom surface of the feature to form the metal silicide predominantly along the bottom surface but not along the oxidized or nitridized sidewalls of the feature. As indicated at 112, 104-110 may be repeated to selectively deposit the metal silicide along the bottom surface of the substrate to a predetermined thickness while advantageously not depositing, or depositing very little, metal silicide along the one or more sidewalls of the of the feature.

Next, at 114, the substrate 200 may be annealed after depositing the metal silicide layer 220. In some embodiments, the anneal temperature is about 500 degrees Celsius to about 1100 degrees Celsius. In some embodiments, the substrate 200 is annealed for about 1 millisecond to about 1 minute. In some embodiments, the anneal helps to form a stable metal silicide structure, for example a stable tantalum silicide (TaSi$_2$) structure.

In some embodiments, as depicted in FIG. 2C, after formation of the metal silicide layer, a capping layer 222 may be deposited within the feature 202. The capping layer may advantageously limit or prevent oxidation of the metal silicide layer. A "capping layer," as used herein, may refer to a layer conformably formed along at least a portion of the sidewalls and/or lower surface of a feature such that a substantial portion of the feature prior to the deposition of the layer remains unfilled after deposition of the layer. In some embodiments, the capping layer 222 may be formed along the entirety of the sidewalls and lower surface of the feature. In some embodiments, the capping layer 222 is a metal containing layer. For example, in some embodiments, the capping layer 222 may contain tungsten (W), aluminum (Al), titanium (Ti), tantalum (Ta), oxides or nitrides thereof, silicides thereof, derivatives thereof, or combinations thereof. In some embodiments, the capping layer 222 is titanium nitride. The capping layer 222 may be formed by any process suitable to provide the capping layer 222 having a suitable thickness. For example, in some embodiments, the capping layer 222 may be formed via a deposition process, such as chemical vapor deposition (CVD), physical vapor deposition (PVD), or a cyclical deposition process, for example, such as atomic layer deposition (ALD), or the like.

In some embodiments, a liner layer 224 may be deposited within the feature 202. A "liner layer," as used herein, refers to a layer conformably formed along at least a portion of the sidewalls and/or lower surface of an opening such that a substantial portion of the opening prior to the deposition of the layer remains unfilled after deposition of the layer. In some embodiments, the liner layer 224 may be formed along the entirety of the sidewalls and bottom surface of the opening. In some embodiments, the liner layer 224 may comprise any material suitable to act as a liner. For example, in some embodiments, the liner layer 224 may comprise a metal, for example, one or more of titanium (Ti), tantalum (Ta), cobalt (Co), manganese (Mn), tungsten (W), hafnium (Hf), alloys thereof, or the like. The liner layer 224 may be formed by any process suitable to provide the liner layer 224 having a suitable thickness. For example, in some embodiments, the liner layer 224 may be formed via a deposition process, such as chemical vapor deposition (CVD), physical vapor deposition (PVD), or a cyclical deposition process, for example, such as atomic layer deposition (ALD), or the like.

Following formation of the capping layer 222 and the liner layer 224, the feature 202 may be filled with a conductive fill material 226. For example, in some embodiments, the conductive fill material 226 may be one or more of copper, cobalt, tungsten, or the like. The conductive fill material 226 may be deposited in the feature 202 using any suitable deposition process, such as CVD or PVD.

Figure 3:
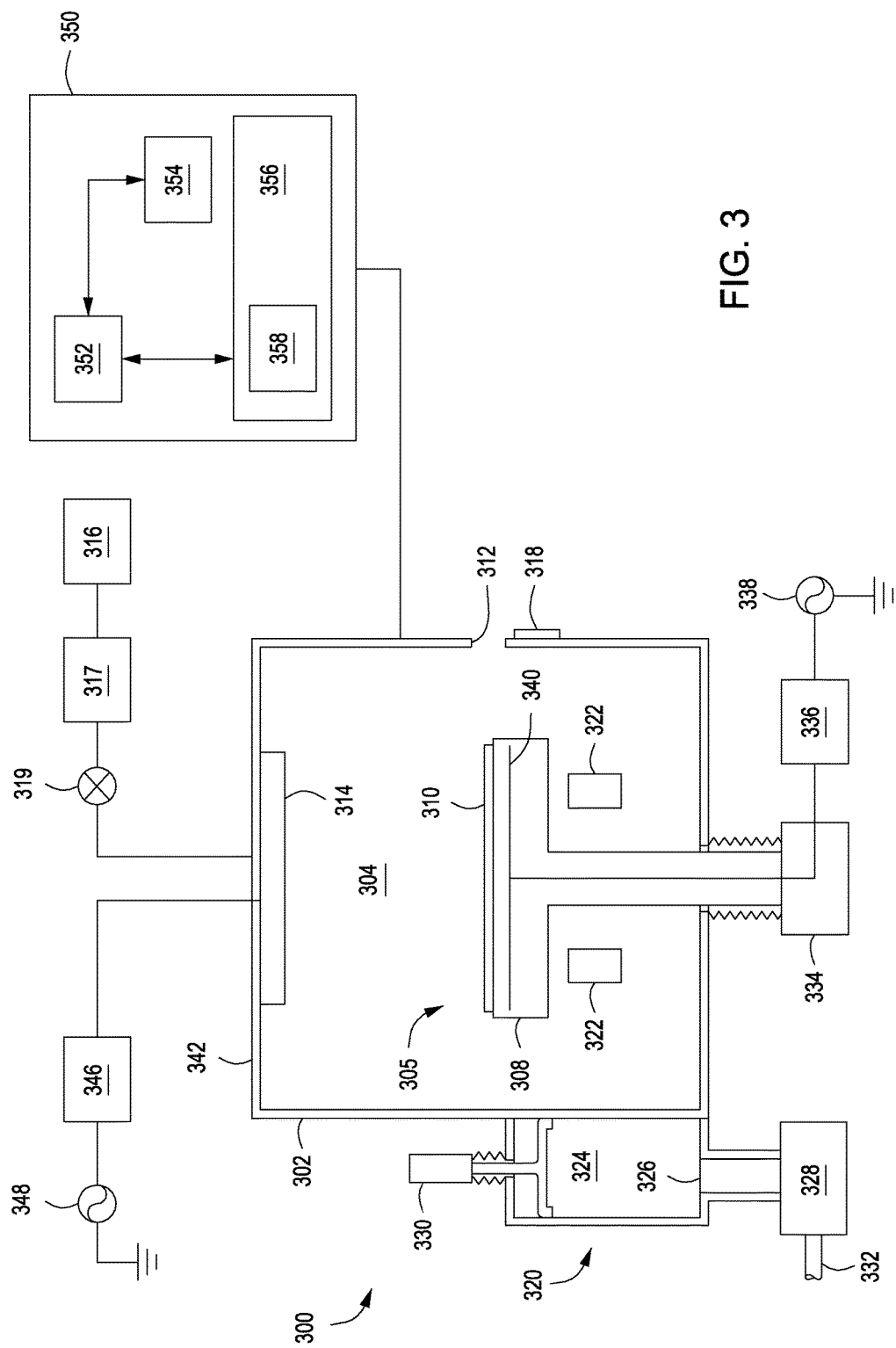
FIG. 3 depicts a process chamber suitable for performing a method of selectively depositing a metal silicide layer in accordance with some embodiments of the present disclosure.

FIG. 3 depicts a schematic diagram of an illustrative apparatus 300 of the kind that may be used to practice embodiments of the disclosure as discussed herein. The apparatus 300 may be any apparatus suitable for performing one or more substrate processes, for example but not limited to, deposition process such as chemical vapor deposition (CVD), atomic layer deposition (ALD), or the like. In some embodiments the process chamber 302 may be a standalone apparatus 300, as depicted below, or a the process chamber 302 may be part of a cluster tool, such as any of the CENTURA®, PRODUCER®, or ENDURA® cluster tools available from Applied Materials, Inc. of Santa Clara, Calif.

The apparatus 300 may comprise a controller 350 and a process chamber 302 having an exhaust system 320 for removing excess process gases, processing by-products, or the like, from the inner volume 305 of the process chamber 302. Exemplary process chambers may include any of several process chambers configured for chemical vapor deposition (CVD) or atomic layer deposition (ALD), available from Applied Materials, Inc. of Santa Clara, Calif. Other suitable process chambers from other manufacturers may similarly be used.

The process chamber 302 has an inner volume 305 that may include a processing volume 304. The processing volume 304 may be defined, for example, between a substrate support 308 disposed within the process chamber 302 for supporting a substrate 310 during processing and one or more gas inlets, such as a showerhead 314 and/or nozzles provided at suitable locations. In some embodiments, the substrate support 308 may include a mechanism that retains or supports the substrate 310 on the surface of the substrate support 308, such as an electrostatic chuck, a vacuum chuck, a substrate retaining clamp, or the like (not shown). In some embodiments, the substrate support 308 may include mechanisms for controlling the substrate temperature (such as heating and/or cooling devices, not shown) and/or for controlling the species flux and/or ion energy proximate the substrate surface.

For example, in some embodiments, the substrate support 308 may include an RF bias electrode 340. The RF bias electrode 340 may be coupled to one or more bias power sources (one bias power source 338 shown) through one or more respective matching networks (matching network 336 shown). The one or more bias power sources may be capable of producing up to 1200 W or RF energy at a frequency of about 2 MHz to about 60 MHz, such as at about 2 MHz, or about 13.56 MHz, or about 60 Mhz. In some embodiments, two bias power sources may be provided for coupling RF power through respective matching networks to the RF bias electrode 340 at respective frequencies of about 2 MHz and about 13.56 MHz. The at least one bias power source may provide either continuous or pulsed power. In some embodiments, the bias power source alternatively may be a DC or pulsed DC source.

The substrate 310 may enter the process chamber 302 via an opening 312 in a wall of the process chamber 302. The opening 312 may be selectively sealed via a slit valve 318, or other mechanism for selectively providing access to the interior of the chamber through the opening 312. The substrate support 308 may be coupled to a lift mechanism 334 that may control the position of the substrate support 308 between a lower position (as shown) suitable for transferring substrates into and out of the chamber via the opening 312 and a selectable upper position suitable for processing. The process position may be selected to maximize process uniformity for a particular process. When in at least one of the elevated processing positions, the substrate support 308 may be disposed above the opening 312 to provide a symmetrical processing region.

The one or more gas inlets (e.g., the showerhead 314) may be coupled to a gas supply 316 for providing one or more process gases through a mass flow controller 317 into the processing volume 304 of the process chamber 302. In addition, one or more valves 319 may be provided to control the flow of the one or more process gases. The mass flow controller 317 and one or more valves 319 may be used individually, or in conjunction, to provide the process gases at predetermined flow rates, such as at a constant flow rate, or pulsed.

Although a showerhead 314 is shown in FIG. 3, additional or alternative gas inlets may be provided such as nozzles or inlets disposed in the ceiling or on the sidewalls of the process chamber 302 or at other locations suitable for providing gases to the process chamber 302, such as the base of the process chamber, the periphery of the substrate support, or the like.

The apparatus 300 has the capability to utilize capacitively coupled RF energy for plasma processing. For example, the process chamber 302 may have a ceiling 342 made from dielectric materials and a showerhead 314 that is at least partially conductive to provide an RF electrode (or a separate RF electrode may be provided). The showerhead 314 (or other RF electrode) may be coupled to one or more RF power sources (one RF power source 348 shown) through one or more respective matching networks (matching network 346 shown). The one or more plasma sources may be capable of producing up to about 3,000 W, or in some embodiments, up to about 5,000 W, of RF energy at a frequency of about 2 MHz and/or about 13.56 MHz or a high frequency, such as 27 MHz and/or 60 MHz. The exhaust system 320 generally includes a pumping plenum 324 and one or more conduits that couple the pumping plenum 324 to the inner volume 305 (and generally, the processing volume 304) of the process chamber 302.

A vacuum pump 328 may be coupled to the pumping plenum 324 via a pumping port 326 for pumping out the exhaust gases from the process chamber via one or more exhaust ports (two exhaust ports 322 shown). The vacuum pump 328 may be fluidly coupled to an exhaust outlet 332 for routing the exhaust to appropriate exhaust handling equipment. A valve 330 (such as a gate valve, or the like) may be disposed in the pumping plenum 324 to facilitate control of the flow rate of the exhaust gases in combination with the operation of the vacuum pump 328. Although a z-motion gate valve is shown, any suitable, process compatible valve for controlling the flow of the exhaust may be utilized.

To facilitate control of the process chamber 302 as described above, the controller 350 may be any form of general-purpose computer processor that can be used in an industrial setting for controlling various chambers and subprocessors. The memory, or computer-readable medium, 356 of the CPU 352 may be one or more of readily available memory such as random access memory (RAM), read only memory (ROM), floppy disk, hard disk, or any other form of digital storage, local or remote. The support circuits 354 are coupled to the CPU 352 for supporting the processor in a conventional manner. These circuits include cache, power supplies, clock circuits, input/output circuitry and subsystems, and the like.

The inventive methods disclosed herein may generally be stored in the memory 356 as a software routine 358 that, when executed by the CPU 352, causes the process chamber 302 to perform processes of the present disclosure. The software routine 358 may also be stored and/or executed by a second CPU (not shown) that is remotely located from the hardware being controlled by the CPU 352. Some or all of the method of the present disclosure may also be performed in hardware. As such, the disclosure may be implemented in software and executed using a computer system, in hardware as, e.g., an application specific integrated circuit or other type of hardware implementation, or as a combination of software and hardware. The software routine 358 may be executed after the substrate 310 is positioned on the substrate support 308. The software routine 358, when executed by the CPU 352, transforms the general purpose computer into a specific purpose computer (controller) 350 that controls the chamber operation such that the methods disclosed herein are performed.

The disclosure may be practiced using other semiconductor substrate processing systems wherein the processing parameters may be adjusted to achieve acceptable characteristics by those skilled in the art by utilizing the teachings disclosed herein without departing from the spirit of the disclosure.

While the foregoing is directed to embodiments of the present disclosure, other and further embodiments of the disclosure may be devised without departing from the basic scope thereof.

The invention claimed is:

1. A method of selectively depositing a metal silicide layer, comprising:
   (a) providing a substrate having a first layer to a process chamber, wherein the first layer comprises a first surface and a feature formed in the first surface comprising an opening defined by one or more sidewalls and a bottom surface, wherein the sidewalls comprise one of silicon oxide or silicon nitride and wherein the bottom surface comprises at least one of silicon or germanium;
   (b) exposing the substrate to a cleaning process comprising exposing the substrate to a remote plasma of a mixture of a fluorine-containing precursor and a hydrogen-containing precursor;
   (c) exposing the substrate to a precursor gas comprising a metal halide;
   (d) purging the precursor gas from the process chamber using an inert gas;
   (e) exposing the substrate to a silicon containing gas comprising silane or derivatives thereof;
   (f) purging the silicon containing gas from the process chamber using an inert gas;
   (g) repeating (c)-(f) to selectively deposit a predominant amount of a metal silicide along the bottom surface to a predetermined thickness, wherein at least some deposition of the metal silicide occurs on the one or more sidewalls, and wherein the metal silicide comprises one of tantalum, hafnium, zirconium, or tungsten; and
   (h) annealing the substrate after depositing the metal silicide layer.

2. The method of claim 1, wherein the opening has a width of less than about 10 nm.

3. The method of claim 1, wherein the precursor gas further comprises an inert gas.

4. The method of claim 1, wherein a flow rate of the precursor gas and the silicon containing gas are each up to about 500 sccm.

5. The method of claim 1, wherein a temperature of the process chamber during exposure to the precursor gas and exposure to the silicon containing gas is about 350 degrees Celsius to about 550 degrees Celsius.

6. The method of claim 1, wherein a pressure of the process chamber during exposure to the precursor gas and exposure to the silicon containing gas is about 2 Tarr to about 15 Tarr.

7. The method of claim 1, wherein the substrate is exposed to the precursor gas for about 1 to about 10 seconds.

8. The method of claim 1, wherein the precursor gas is one of tantalum pentachloride ($TaCl_5$), hafnium tetrachloride (HfCl$_4$), zirconium tetrachloride (ZrCl$_4$), tungsten hexachloride (WCl$_6$), or tungsten pentachloride (WCl$_5$).

9. The method of claim 1, wherein the substrate is exposed to the silicon containing gas for about 0.5 to about 5 seconds.

10. The method of claim 1, wherein a temperature of the substrate during the anneal is about 500 degrees Celsius to about 1100 degrees Celsius.

11. The method of claim 1, wherein the substrate is annealed for about 1 millisecond to about 1 minute.

12. The method of claim 1, further comprising depositing a capping layer within the feature after deposition of the metal silicide layer.

13. The method of claim 12, wherein the capping layer comprises titanium nitride (TiN).

14. The method of claim 12, further comprising depositing a liner layer atop the capping layer.

15. The method of claim 14, wherein the liner layer comprise one or more of titanium (Ti), tantalum (Ta), cobalt (Co), manganese (Mn), tungsten (W), or hafnium (Hf).

16. The method of claim 15, further comprising depositing a conductive fill material to substantially fill the feature.

17. A method of selectively depositing a metal silicide layer, comprising:
  (a) providing a substrate having a first layer to a process chamber, wherein the first layer comprises a first surface and a feature formed in the first surface comprising an opening having a width of less than about 10 nm and defined by one or more sidewalls and a bottom surface, wherein the sidewalls comprise one of silicon oxide or silicon nitride and wherein the bottom surface comprises at least one of silicon or germanium;
  (b) exposing the substrate to a cleaning process comprising exposing the substrate to a remote plasma of a mixture of a fluorine-containing precursor and a hydrogen-containing precursor;
  (c) exposing the substrate to a precursor gas comprising a metal halide for about 1 to about 10 seconds, wherein a flow rate of the precursor gas is up to about 500 sccm and wherein a pressure of the process chamber during exposure to the precursor gas is about 2 Tarr to about 15 Tarr;
  (d) purging the precursor gas from the process chamber using an inert gas;
  (e) exposing the substrate to a silicon containing gas comprising silane or derivatives thereof for about 0.5 to about 5 seconds, wherein a flow rate of the silicon containing gas is up to about 500 sccm and wherein a pressure of the process chamber during exposure to the silicon containing gas is about 2 Torr to about 15 Torr;
  (f) purging the silicon containing gas from the process chamber using an inert gas;
  (g) repeating (c)-(f) to selectively deposit a predominant amount of a metal silicide along the bottom surface to a predetermined thickness, wherein at least some deposition of the metal silicide occurs on the one or more sidewalls, and wherein the metal silicide comprises one of tantalum, hafnium, zirconium, or tungsten;
  (h) annealing the substrate at a temperature of about 500 to about 1100 degrees Celsius for about 1 millisecond to about 1 minute after depositing the metal silicide layer;
  (i) depositing a capping layer within the feature after depositing and annealing the metal silicide layer;
  (j) depositing a liner layer atop the capping layer; and
  (k) depositing a conductive fill material atop the liner layer to substantially fill the feature.

18. The method of claim 17, wherein the precursor gas is one of tantalum pentachloride (TaCl$_5$), hafnium tetrachloride (HfCl$_4$), zirconium tetrachloride (ZrCl$_4$), tungsten hexachloride (WCl$_6$), or tungsten pentachloride (WCl$_5$).

19. A non-transitory computer readable medium, having instructions stored thereon which, when executed, cause a process chamber to perform a method for selectively depositing a metal silicide layer on a substrate having a first layer, wherein the first layer comprises a first surface and a feature formed in the first surface comprising an opening defined by one or more sidewalls and a bottom surface wherein the sidewalls comprise one of silicon oxide or silicon nitride and wherein the bottom surface comprises at least one of silicon or germanium, the method comprising:
  (a) exposing the substrate to a cleaning process comprising exposing the substrate to a remote plasma of a mixture of a fluorine-containing precursor and a hydrogen-containing precursor;
  (b) exposing the substrate to a precursor gas comprising a metal halide;
  (c) purging the precursor gas from the process chamber using an inert gas;
  (d) exposing the substrate to a silicon containing gas comprising silane or derivatives thereof;
  (e) purging the silicon containing gas from the process chamber using an inert gas;
  (f) repeating (b)-(e) to selectively deposit a predominant amount of a metal silicide along the bottom surface to a predetermined thickness, wherein at least some deposition of the metal silicide occurs on the one or more sidewalls, and wherein the metal silicide comprises one of tantalum, hafnium, zirconium, or tungsten; and
  (g) annealing the substrate after depositing the metal silicide layer.

\* \* \* \* \*